(12) United States Patent
Ozeki et al.

(10) Patent No.: US 10,763,412 B2
(45) Date of Patent: Sep. 1, 2020

(54) LIGHT EMITTING DEVICE

(71) Applicant: NICHIA CORPORATION, Anan-shi (JP)

(72) Inventors: Kenji Ozeki, Tokushima (JP); Shimpei Maeda, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/536,325

(22) Filed: Aug. 9, 2019

(65) Prior Publication Data

US 2019/0363231 A1 Nov. 28, 2019

Related U.S. Application Data

(62) Division of application No. 15/800,072, filed on Nov. 1, 2017, now Pat. No. 10,424,705.

(30) Foreign Application Priority Data

Nov. 1, 2016 (JP) .................................. 2016-214618
Jul. 12, 2017 (JP) .................................. 2017-136177
Jul. 28, 2017 (JP) .................................. 2017-146504

(51) Int. Cl.
*H01L 33/00* (2010.01)
*H01L 33/60* (2010.01)
(Continued)

(52) U.S. Cl.
CPC .......... *H01L 33/60* (2013.01); *H01L 25/0753* (2013.01); *H01L 33/507* (2013.01);
(Continued)

(58) Field of Classification Search
CPC ....... H01L 33/60; H01L 33/507; H01L 33/54; H01L 33/56; H01L 25/0753
(Continued)

(56) References Cited

U.S. PATENT DOCUMENTS 8,860,061 B2 * 10/2014 Kotani ................ H01L 33/54
257/98
2011/0198991 A1 8/2011 Jeong et al.
(Continued)

FOREIGN PATENT DOCUMENTS

JP 5521325 B2 7/2010
JP 2010-192629 9/2010
(Continued)

OTHER PUBLICATIONS

Office Action with Form PTO-892 Notice of References Cited issued by the U.S. Patent and Trademark Office for the parent U.S. Appl. No. 15/800,072, dated Nov. 30, 2018.
(Continued)

*Primary Examiner* — Tan N Tran
(74) *Attorney, Agent, or Firm* — Mori & Ward, LLP

(57) ABSTRACT

A light emitting device includes light emitting elements having light extraction faces, respectively. A light transmissive member includes a lower face facing the light extraction faces, an upper face opposite to the lower face in a height direction, and first to fourth side faces that are connected to the lower face and the upper face. An area of the lower face is larger than a sum of areas of the light extraction faces. An area of the upper face is smaller than the area of the lower face. The second side face is substantially parallel to the first side face. The third side face and the fourth side face are provided between the first side face and the second side face and opposite to each other. The third side face and the fourth side face approach as approaching from the lower face to the upper face in the height direction.

15 Claims, 10 Drawing Sheets

(51) Int. Cl.
*H01L 33/54* (2010.01)
*H01L 25/075* (2006.01)
*H01L 33/50* (2010.01)
*H01L 33/56* (2010.01)
*H01L 33/62* (2010.01)

(52) U.S. Cl.
CPC ............. *H01L 33/54* (2013.01); *H01L 33/56* (2013.01); *H01L 33/62* (2013.01); *H01L 33/0095* (2013.01); *H01L 2933/005* (2013.01); *H01L 2933/0041* (2013.01); *H01L 2933/0058* (2013.01); *H01L 2933/0066* (2013.01)

(58) Field of Classification Search
USPC ...................................................... 257/88, 98
See application file for complete search history.

(56) References Cited

U.S. PATENT DOCUMENTS

| | | | |
|---|---|---|---|
| 2012/0025218 A1 | 2/2012 | Ito et al. | |
| 2012/0242216 A1 | 9/2012 | Kotani et al. | |
| 2012/0299043 A1 | 11/2012 | Hsu | |
| 2012/0305970 A1 | 12/2012 | Kim | |
| 2014/0131753 A1* | 5/2014 | Ishida | H01L 25/0753 |
| | | | 257/98 |
| 2014/0203306 A1 | 7/2014 | Ito | |
| 2015/0263254 A1* | 9/2015 | Miyoshi | H01L 33/505 |
| | | | 257/98 |
| 2017/0084802 A1 | 3/2017 | Chiu | |

FOREIGN PATENT DOCUMENTS

| | | |
|---|---|---|
| JP | 2010-219324 | 9/2010 |
| JP | 2010-283281 | 12/2010 |
| JP | 2012-199411 | 10/2012 |
| JP | 2013-168685 | 8/2013 |
| JP | 2013-175759 | 9/2013 |
| JP | 2014-143300 | 8/2014 |
| JP | 2014-207349 | 10/2014 |
| JP | 2017-183427 | 10/2017 |
| WO | WO2014/081042 | 5/2014 |
| WO | WO 2014/081042 | 5/2014 |
| WO | WO 2014/122881 | 8/2014 |

OTHER PUBLICATIONS

Notice of Allowance issued by the United States Patent and Trademark Office for the parent U.S. Appl. No. 15/800,072, dated May 15, 2019.

* cited by examiner

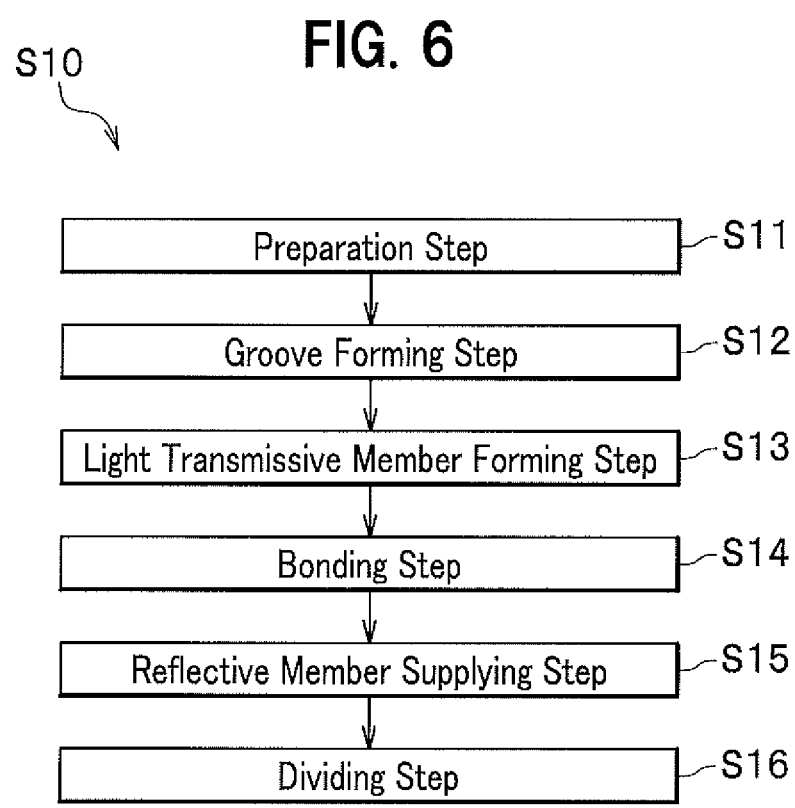

LIGHT EMITTING DEVICE

CROSS-REFERENCE TO RELATED APPLICATION

This application is a divisional application of the U.S. patent application Ser. No. 15/800,072 filed Nov. 1, 2017, which claims priority to Japanese Patent Application No. 2016-214618, filed on Nov. 1, 2016, No. 2017-136177, filed on Jul. 12, 2017, and No. 2017-146504, filed on Jul. 28, 2017, the disclosure of which is hereby incorporated by reference in its entirety.

BACKGROUND

Field of the Invention

The present disclosure relates to a light emitting device.

Discussion of the Background

Light emitting devices employing light emitting elements are widely used as vehicular headlights and indoor and outdoor lighting fixtures. For example, the light emitting device disclosed in PCT Publication No. WO/2014/081042 includes a circuit board, a light emitting element mounted on the upper surface of the circuit board, a phosphor resin layer arranged on the upper surface of the light emitting element, a diffusion resin layer arranged on the upper surface of the phosphor resin layer for diffusing the emitted light from the light emitting element, a first reflective material sealing the lateral faces of the light emitting element disposed on the circuit board, and a second reflective material surrounding the lateral faces of the diffusion resin layer. In the light emitting device configured as above, the wavelength of some of the light emitted from the light emitting element is converted by the phosphor in the phosphor resin layer, and the rest of the light emitted from the light emitting element is externally released as direct radiation without undergoing wavelength conversion by the phosphor contained in the phosphor resin layer.

In the light emitting device described above, both the phosphor resin layer and the diffusion resin layer are formed with a resin. The phosphor resin layer, which has an area larger than that of the diffusion resin layer, is formed to have an area in excess of the upper face of the light emitting element. Furthermore, part of the second reflective material is arranged above the upper face of the light emitting element. The light emitting device is thus structured to be able to emit light upwards in a narrower range of area.

SUMMARY

A light emitting device according to one embodiment of the present invention includes light emitting elements and a light transmissive member. The light emitting elements have light extraction faces, respectively. The light transmissive member is provided on the light emitting elements to face light extraction faces in a height direction of the light emitting device. The light transmissive member includes a lower face, an upper face, a first side face, a second side face, a third side face, and a fourth side face. The lower face faces the light extraction faces. An area of the lower face is larger than a sum of areas of the light extraction faces. The upper face is provided opposite to the lower face in the height direction. An area of the upper face is smaller than the area of the lower face. A first side face is connected to the lower face and the upper face. A second side face is connected to the lower face and the upper face and provided opposite to the first side face to be substantially parallel to the first side face. The third side face is connected to the lower face and the upper face and provided between the first side face and the second side face. The fourth side face is connected to the lower face and the upper face and provided between the first side face and the second side face and opposite to the third side face. The third side face and the fourth side face approaches as approaching from the lower face to the upper face in the height direction.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

FIG. 6 is a flowchart of the method for manufacturing a light emitting device according to one embodiment.

DESCRIPTION OF THE EMBODIMENTS

Figure 1:
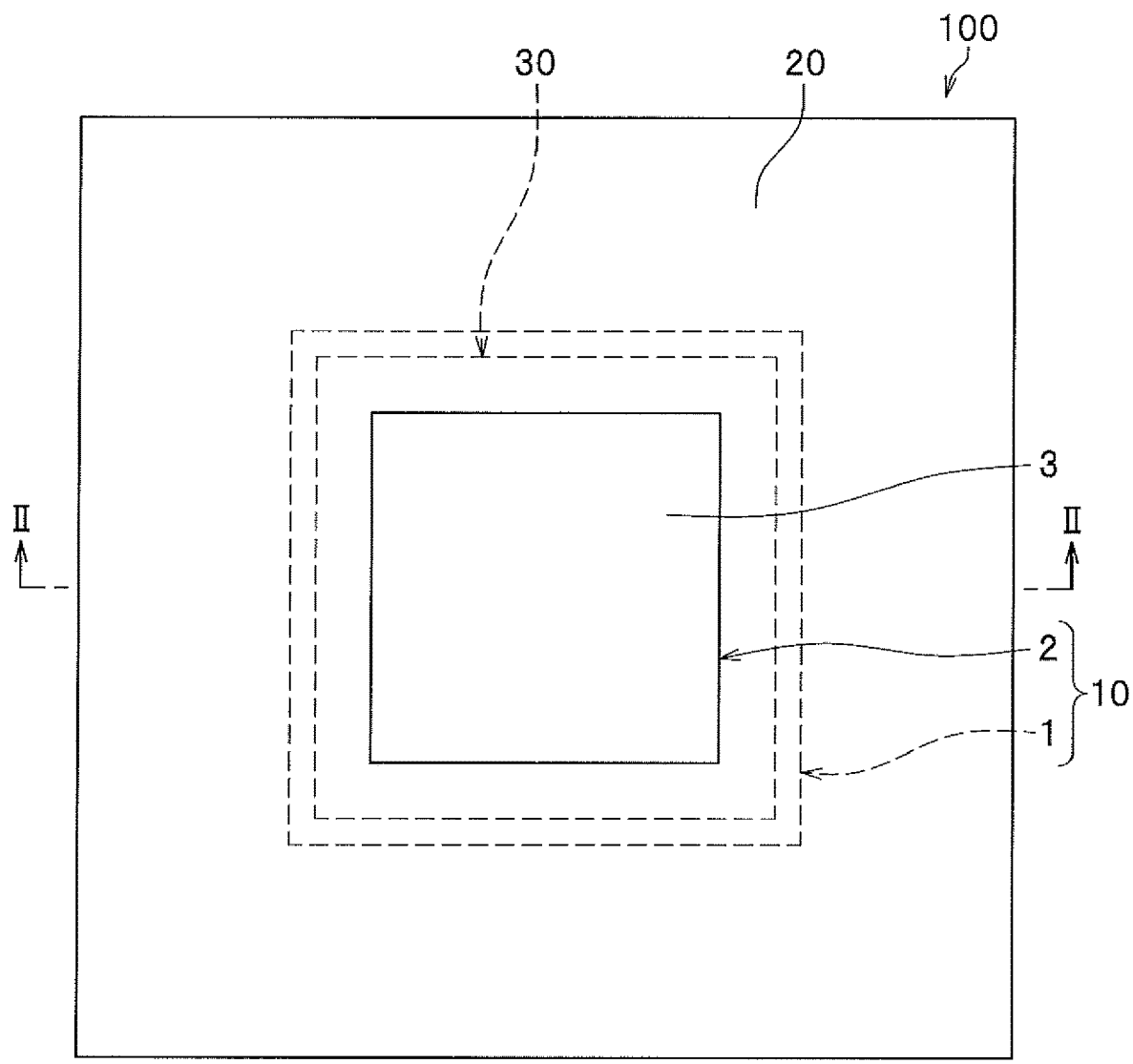
FIG. 1 is a schematic plan view of the light emitting device according to one embodiment.

The embodiments will now be described with reference to the accompanying drawings, wherein like reference numerals designate corresponding or identical elements throughout the various drawings.

The light emitting devices according to certain embodiments of the invention will be explained below with reference to the accompanying drawings. The drawings referred to in the following explanations schematically show the embodiments of the invention, and thus the sizes, spacing, and relative positions of the members might be exaggerated, or certain members might be omitted. In the explanations below, moreover, those having the same designations or reference numerals indicate the same or homogeneous as a general rule, for which the explanations might be omitted when appropriate. Furthermore, the directions indicated in the drawings show relative positions of the constituent elements, and are not intended to show absolute positions thereof.

One example of the structure of the light emitting device according to an embodiment will be explained with reference to FIG. 1 to FIG. 4.

The light emitting device 100 includes at least one light emitting element 30 each having upper face is the light extraction face, a first light transmissive member 1 disposed to be bonded to the upper face of the light emitting element 30 and formed with a phosphor-containing resin material, and a second light transmissive member 2 disposed to be bonded to the upper face of the first light transmissive member 1 and formed with a glass material. The lower face perimeter of the first light transmissive member 1 is positioned outside an upper face perimeter of the light emitting element 30 in a plan view, the lower face perimeter of the second light transmissive member 2 coincides with the upper face perimeter of the first light transmissive member 1 or is positioned inside the upper face perimeter of the first light transmissive member 1 in a plan view, while an upper face perimeter of the second light transmissive member 2 is positioned inside the upper face perimeter of the first light transmissive member 1 in a plan view.

In the present embodiment, the first light transmissive member 1 and the second light transmissive member 2 are formed as an integrated light transmissive member 10. The light transmissive member 10 includes the first light transmissive member 1 and the second light transmissive member 2 each having an upper face and a lower face, and the upper face 5 of the first light transmissive member and the lower face 8 of the second light transmissive member are bonded together to structure the light transmissive member 10. The light from the light emitting element 30 enters from the lower face 7 of the first light transmissive member and is externally released from the upper face 3 of the second light transmissive member.

Light Emitting Element

In the present embodiment, the light emitting element 30 is flip chip mounted on the conductive wiring of the mounting base 40 via a bonding member. The light emitting element 30 has a lower face on which a pair of electrodes are formed in the same face, and an upper face 31, in other words, the face opposite the lower face serving as the light extraction face. For the light emitting element 30, a known light emitting element can be utilized, and for example, a light emitting diode or laser diode is preferably used. Moreover, an emission wavelength can be appropriately selected for the light emitting element 30. For example, for a blue or green light emitting element, one employing a nitride based semiconductor ($In_XAl_YGa_{1-X-Y}N$, $0 \leq X$, $0 \leq Y$, $X+Y \leq 1$) or GaP can be used. For a red light emitting element, GaAlAs, AlInGaP, or the like can be used other than nitride based semiconductor elements. The light emitting element 30 can be moreover, semiconductor light emitting elements made of a material other than those described above, alternatively. The composition, the emission color, the size, and the number of light emitting elements 30 can be suitably selected for the intended purpose. One having a set of positive and negative electrodes on one face is preferable for the light emitting element 30. This allows for the light emitting element 30 to be flip chip mounted on a mounting base 40. In this case, the face opposite the face on which the set of electrodes are formed serves as the primary light extraction face of the light emitting element. In the case where a light emitting element 30 is mounted face up on the mounting base 40, the face on which a set of electrodes is formed serves as the primary light extraction face of the light emitting element 30. The light emitting element 30 can be electrically connected to a mounting base 40 via bonding members, such as bumps.

Light Transmissive Member

The light transmissive member 10 is disposed to be bonded to the upper face 31 of the light emitting element 30 of the light emitting device 100. The light transmissive member 10 includes a first light transmissive member 1 and a second light transmissive member 2 each having an upper face and a lower face, and is structured by bonding the upper face 5 of the first light transmissive member to the lower face 8 of the second light transmissive member. The first light transmissive member 1 is a resin layer containing a phosphor, and the second light transmissive member 2 is a glass plate which has the role as a support for the first light transmissive member 1. The light transmissive member 10 has a protrusion providing the upper face 3 of the second light transmissive member with a smaller area than that of the lower face 7 of the first light transmissive member. The lateral faces 6 of the first light transmissive member are positioned outside the lateral faces 4 of the second light transmissive member in a plan view.

The thickness of the light transmissive member 10 is about 60 μm to 300 μm, for example. The thickness of the second light transmissive member 2 is about 50% to 90% of the thickness of the light transmissive member 10 mentioned above, for example.

First Light Transmissive Member

The first light transmissive member 1 is disposed to be bonded to the upper face 31 of the light emitting element 30.

The first light transmissive member 1 is formed with a resin material which contains a phosphor 11. The first light transmissive member 1, for example, is a plate-like shape, and has an upper face 5, a lower face 7 opposing the upper face 5, and lateral faces 6 each in contact with the upper face 5 and the lower face 7.

The lower face 7 of the first light transmissive member is a surface through which the light from at least one light emitting element 30 included in the light emitting device 100 enters. The lower face 7 is formed to have a larger area than the sum of the upper faces 31 of one or more light emitting elements 30 bonded to the lower face 7. The lower face 7 of the first light transmissive member is formed to be substantially flat.

In the present embodiment, the upper face 5 of the first light transmissive member is formed to be substantially in parallel to the lower face 7. The lateral faces 6 of the first light transmissive member are formed substantially perpendicular to the lower face 7 of the first light transmissive member. Forming the lateral faces 6 substantially perpendicular to the lower face 7 can reduce a probability that the bonding material 15 bonding the first light transmissive member 1 and the light emitting element 30 creeps onto the lateral faces 6 when manufacturing the light emitting device 100. Suppressing creepage of the bonding material 15 onto the lateral faces 6 can discourage or prevent the light emitted from the light emitting element 30 from externally leaking without passing through the first light transmissive member 1.

Furthermore, the lower face 7 of the first light transmissive member is formed to be larger than the upper face 31 of the light emitting element 30 in such a manner as to entirely cover the upper face 31 of the light emitting element 30. In other words, the perimeter of the lower face 7 of the first light transmissive member is positioned outside the perimeter of the upper face 31 of the light emitting element 30 in a plan view. The lower face 7 of the first light transmissive member is formed to have a larger area than the upper face 31 of the light emitting element 30, thereby allowing the light emitted from the light emitting element 30 to enter the first light transmissive member 1 with a minimum loss. The lower face 7 of the first light transmissive member is formed to have a larger area in the range of from 105 to 150% of the sum of the upper faces 31 of one or more light emitting elements 30 bonded to the lower face 7. The first light transmissive member 1 allows the light emitted from the light emitting element 30 to enter from the lower face 7, and then to enter the second light transmissive member 2 through the lower face 8 of the second light transmissive member.

The first light transmissive member 1 is formed with a resin material containing a phosphor 11 that can convert the wavelength of at least some of the light emitted from the light emitting element 30. Examples of resin materials include silicone resins, epoxy resins, phenol resins, polycarbonate resins, acrylic resins, TPX resins, polynorbornene resins, or modified or hybrid resins of these. Among these examples, the first light transmissive member preferably includes a silicone resin due to its highly heat resistant, highly electrically insulating, and flexibility.

For the phosphor 11, a phosphor used in the art can be suitably selected. Examples of phosphors that can be excited by a blue or ultraviolet light emitting element include cerium-activated yttrium aluminum garnet-based phosphors (YAG:Ce), cerium-activated lutetium aluminum garnet-based phosphors (LAG:Ce), europium- and/or chromium-activated nitrogen-containing calcium aluminosilicate-based phosphors ($CaO-Al_2O_3-SiO_2$:Eu), europium-activated silicate-based phosphors ($(Sr,Ba)_2SiO_4$:Eu), nitride-based phosphors, such as β-SiAlON phosphors, CASN-based phosphors ($CaAlSiN_3$:Eu), and SCASN-based phosphors ($(Sr,Ca)AlSiN_3$:Eu), KSF-based phosphors ($K_2SiF_6$:Mn), sulfide-base phosphors, and quantum dot phosphors. By combining these phosphors 11 and blue or ultraviolet light emitting elements, light emitting devices of various emission colors, for example, a white light emitting device, can be manufactured. The type and the concentration of the phosphor 11 contained in the first light transmissive member 1 can be adjusted to manufacture a light emitting device 100 capable of emitting white light. The concentration of the phosphor 11 contained in the first light transmissive member 1 can be about 30 to 80 percent by mass, for example.

The first light transmissive member 1 may further contain a light diffuser. Examples of the light diffuser include titanium oxide, barium titanate, aluminum oxide, silicon oxide or the like. The phosphor 11 may be dispersed across the entire light transmissive member 1, or localized near the upper or lower face of the first light transmissive member 1.

Moreover, by using a blue light emitting element for the light emitting element 30, and a nitride-based semiconductor having a large red component for the phosphor, a red light emitting device can be produced. By using a blue light emitting element for the light emitting element 30, and a YAG phosphor in combination with a nitride-based phosphor having a large red component for the phosphor, an amber light emitting device can be produced. The color amber refers to the chromaticity range corresponding to the region composed of the longer wavelength region of yellow and the shorter wavelength region of yellow-red as specified in JIS Z8110, or the region between the yellow region and the shorter wavelength region of yellow-red of the safety colors as specified in JIS Z9101. For example, the amber color refers to the region over the dominant wavelength in a range of from 580 nm to 600 nm. Many phosphors that emit red or amber light have a low light conversion efficiency, the concentration of the phosphor is preferably increased to achieve a desired color tone. In the case of manufacturing a red or amber light emitting device, the concentration of the phosphor contained in the first light transmissive member 1 is, for example, about 60 to 80 percent by mass.

Second Light Transmissive Member 2

The second light transmissive member 2 is disposed to be bonded to the upper face of the first light transmissive member 1. The second light transmissive member 2 is formed with a glass material. The second light transmissive member 2 is, for example, plate-like shape, and has an upper face 3, a lower face 8 which opposes the upper face 3, and lateral faces 4 each contacting the upper face 3 and the lower face 8. The lower face 8 of the second light transmissive member 2 is formed to have an area that is the same as, or smaller than, the upper face 5 of the first light transmissive member 1. The lower face 8 shown in FIGS. 1-4 has a smaller area by way of example. In other words, the perimeter of the lower face 8 of the second light transmissive member 2 coincides with the perimeter of the upper face 5 of the first light transmissive member 1 or is located inside the perimeter of the upper face 5 of the first light transmissive member 1 in a plan view, and the perimeter of the upper face 3 of the second light transmissive member 2 is positioned inside the perimeter of the upper face 5 of the first light transmissive member 1 in a plan view. The area of the upper face 3 of the second light transmissive member 2 is preferably smaller than the sum of the areas of the upper faces 31 of the one or more light emitting elements 30. Moreover, the area of the upper face 3 of the second light transmissive member 2 is preferably 70% at most of the lower face 7 of the first light transmissive member 1, more preferably 50% at most. By setting the upper face 3 of the second light transmissive member to have a n area smaller than that of the lower face 7 of the first light transmissive member as described above, the light emitted from the light emitting element 30 and then entering from the lower face 7 of the first light transmissive member 1 can be released from the upper face 3 of the second light transmissive member 2 (i.e., the emission face of the light emitting device 100) which has a smaller area than the upper face 31 of the light emitting element 30. In other words, an emission face which is narrowed by the second light transmissive member 2, the high luminance light emitting device 100 can release light traveling a longer distance.

The lateral faces 4 of the second light transmissive member are formed substantially perpendicular to the upper face 3 of the second light transmissive member. Forming the lateral faces 4 substantially perpendicular to the upper face 3 of the second light transmissive member can discourage or prevent the reflective member 20 covering the lateral faces 4 of the second light transmissive member from creeping onto the upper face 3 when manufacturing the light emitting device 100. The angle formed by the upper face 3 and each lateral face 4 of the second light transmissive member 2 that can discourage or prevent the creepage of the reflective member 20 is, for example, 90 degrees plus or minus 5 degrees, and this range is referred to as substantially perpendicular herein. By forming the lateral faces 4 of the second light transmissive member 2 substantially perpendicular to the upper face 3, in the case where the upper face 3 of the second light transmissive member serves as the emission face of the light emitting device 100, the light emitting device 100 can exhibit an upper face in which the boundary is clearly defined between the emission part and the non-emission part.

The thickness of the second light transmissive member 2 is preferably equal to or larger than that of the first light transmissive member 1. For example, the thickness of the second light transmissive member 2 is about 30 µm to 270 µm. The second light transmissive member 2 is formed with a glass material, and examples of glass materials include borosilicate glasses, quartz glasses, sapphire glasses, calcium fluoride glasses, alumino-borosilicate glasses, oxynitride glasses, chalcogenide glasses, and the like. The glass material used may have an anti-reflection (AR) coating on the upper face and/or the lower face thereof. The second light transmissive member 2 preferably has a refractive index close to that of the first light transmissive member 1.

As discussed above, the first light transmissive member 1 is a resin layer containing a phosphor 11. The second light transmissive member 2 is a glass material, where the second light transmissive member 2 functions as the support for the first light transmissive material 1. Thus, by increasing the concentration of the phosphor 11 contained in the first light transmissive member 1, the phosphor layer, i.e., the thickness of the first light transmissive member 1, can be formed with reduced thickness.

The first light transmissive member 1 is formed with a resin material, which is more flexible than the second light transmissive member 2 made of a glass material, therefore it is not prone to damages even if the thickness is reduced. Even if the upper face 5 of the first light transmissive member is formed larger than the lower face 8 of the second light transmissive member, damages to the first light transmissive member 1, such as cracking or chipping, during manufacturing or use, can be reduced. This makes it possible to form the upper face area of the second light transmissive member 2 smaller than the lower face area of the first light transmissive member 1, thereby enabling realization of the light emitting device 100 higher luminance.

Furthermore, the light emitting device 100 has a narrowed emission face which is the second light transmissive member 2 made of a glass material, therefore, the emission face of the light emitting device 100 is not susceptible to degradation attributable to long term use.

Bonding Material

The light emitting element 30 and the light transmissive member 10 can be bonded together using a bonding material 15. The bonding material 15 is disposed continuously from the upper face of the light emitting element 30 to at least part of each lateral face while being interposed between the reflective member 20 and the lateral faces of the light emitting element 30. The upper face of the bonding material 15 interposed between the reflective member 20 and the lateral faces of the light emitting element 30 is in contact with the lower face 7 of the first light transmissive member. For the bonding material 15, it is preferable to use a light transmissive material that can guide the light emitted from the light emitting element 30 into the first light transmissive member 1. Examples of the bonding material 15 can be a known bonding material, such as epoxy resins or silicone resins, an organic bonding material having a high refractive index, an inorganic bonding material, a low melting point glass, or the like. The bonding material 15 is preferably disposed to extend from the upper face 31 of the light emitting element 30 to the lateral faces while forming fillets 16. Preferably, the fillets 16 are in contact with both the lower face 7 of the first light transmissive member and the lateral faces of the light emitting element 30, and each have a curved face that is concave with respect to the reflective member 20. Such a shape allows the fillet surfaces of the bonding member 15 to readily reflect the light emitted from the light emitting element 30, and guide the light into the first light transmissive member 1.

The light transmissive member 10 and the light emitting element 30 may be bonded together by crimping or the like instead of using a bonding material 15.

Figure 2:
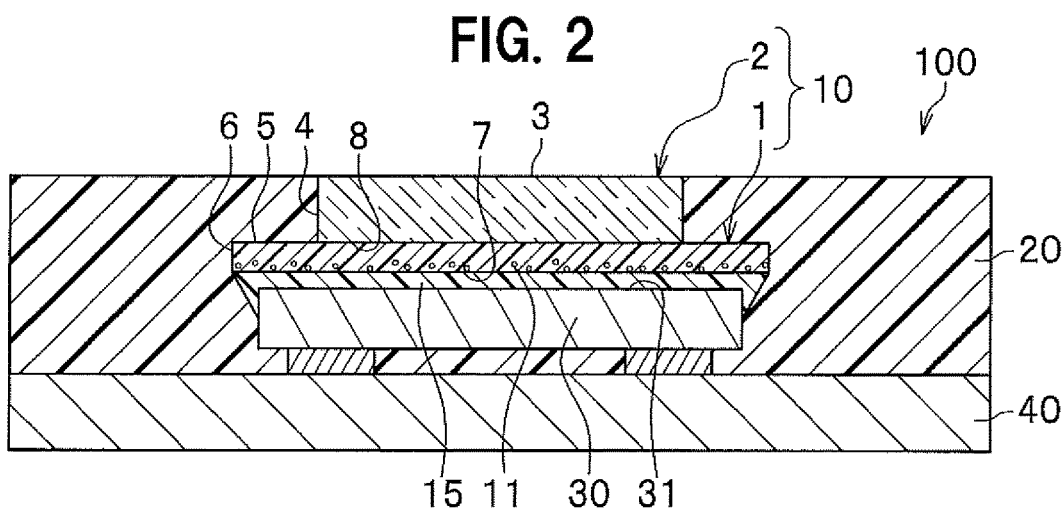
FIG. 2 is a cross-sectional view of the light emitting device in FIG. 1 taken along line II-II.
Figure 3:
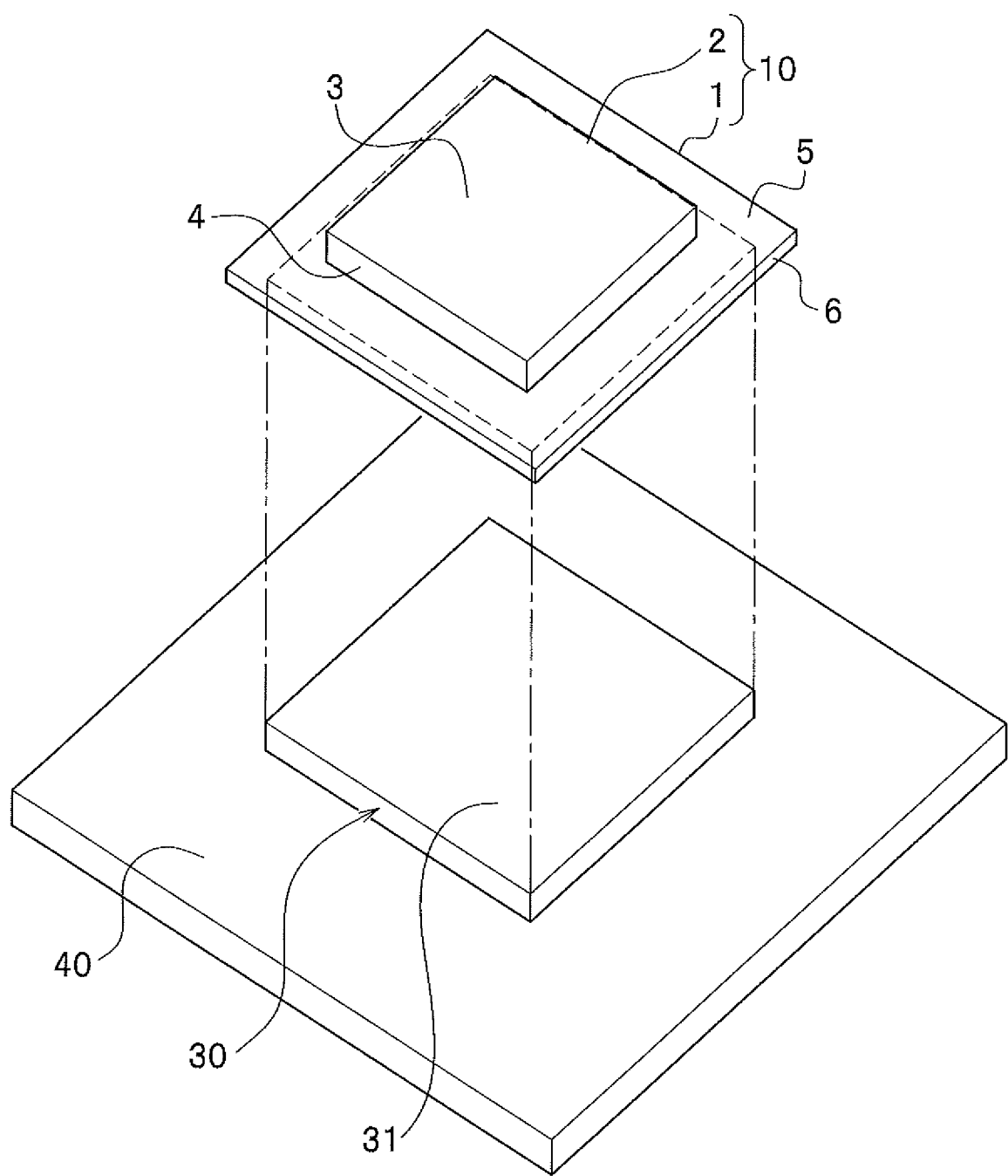
FIG. 3 is an exploded perspective view of the light emitting device according to the embodiment.
Figure 4:
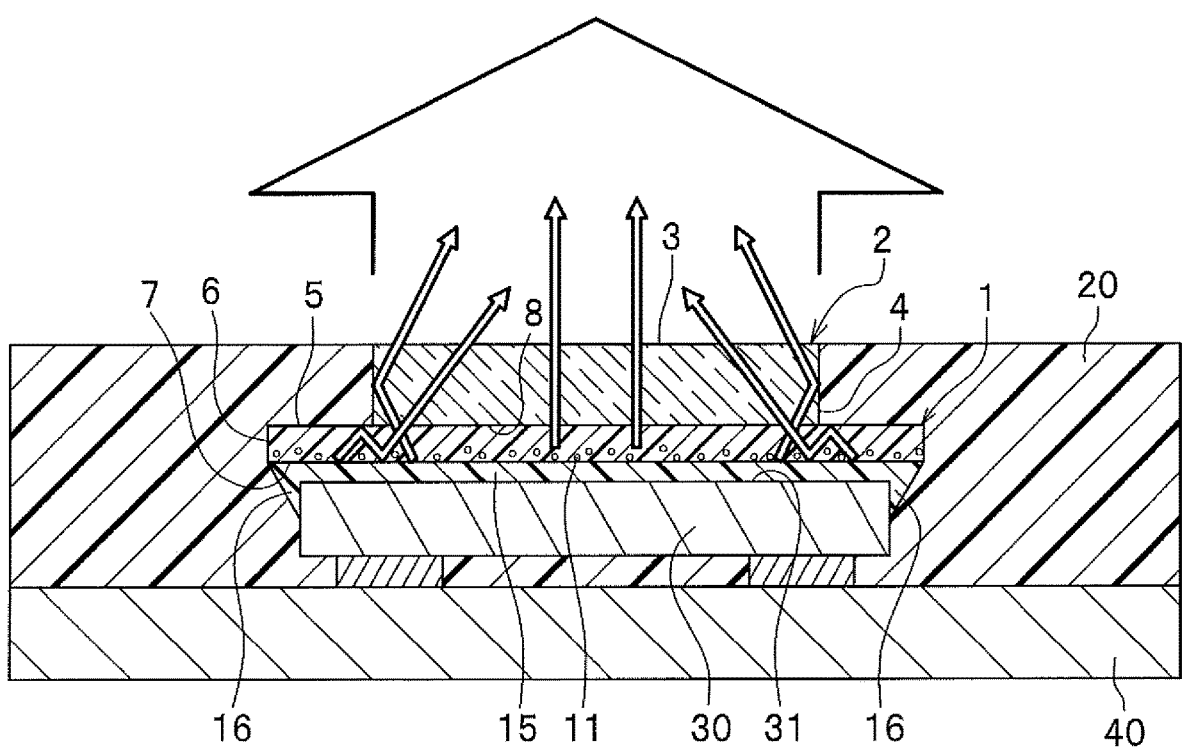
FIG. 4 is a cross-sectional view schematically showing the light emission of the light emitting device according to the embodiment.

The reflective member 20, as shown in FIG. 1, FIG. 2, and FIG. 4, reflects the light traveling in the directions other than towards the upper face 3 of the second light transmissive member such that it is released from the upper face 3 of the second light transmissive member, as well as covering the lateral faces of the light emitting element 30 to protect the light emitting element 30 from external forces, dust, gas, or the like. The reflective member 20 is disposed to cover the first light transmissive member, light emitting element 30, and part of the upper face of the mounting base 40 while exposing the upper face 3 of the light transmissive member 10 (i.e., the upper face 3 of the second light transmissive member) to serve as the emission face of the light emitting device 100. Specifically, the reflective member 20 is disposed to cover the lateral faces 4 of the second light transmissive member, the upper face 5 and the lateral faces 6 of the first light transmissive member, the lateral faces of the bonding material 15, and the lateral faces and the lower face of the light emitting element 30. The light extraction face of the light emitting element 30 is exposed from the reflective member 20, and is bonded to the lower face 7 of the first light transmissive member to allow the light to enter the light transmissive member 10. The reflective member 20 is formed with a material that can reflect the light from the light emitting member 30, and reflects the light at the interfaces between the light transmissive member 10 and the reflective member 20 to allow the light to enter the light transmissive member 10. In this manner, the light emitted from the light emitting element 30 is reflected by the reflective member 20 to pass through the light transmissive member 10 to be externally released from the upper face 3 of the second light transmissive member which is the emission face of the light emitting device 100.

Here, the upper face of the reflective member 20 preferably has a height that is the same as, or lower than, that of the upper face 3 of the second light transmissive member. The light released from the upper face 3 of the second light transmissive member serving as the emission face of the light emitting device 100 also laterally spreads. For this reason, if the upper face of the reflective member 20 is higher than the upper face 3 of the second light transmissive member, the light emitted from the upper face 3 of the second light transmissive member can hit and be reflected by the upper face of the reflective member 20, causing variance in luminous intensity to occur. Accordingly, the reflective member 20 is disposed to cover the exterior lateral faces of the second light transmissive member such that the height of the upper face of the reflective member 20 is substantially the same as, or lower than, the upper face 3 of the second light transmissive member. This is preferable because the light emitted from the light emitting element 30 can be efficiently extracted.

The reflective member 20 can be formed by adding a light reflecting substance to the base material made of a silicone resin, modified silicone resin, epoxy resin, modified epoxy resin, acrylic resin, or a hybrid resin containing at least one of these resins. Examples of the light reflecting substance include titanium oxide, silicon oxide, zirconium oxide, yttrium oxide, yttria-stabilized zirconia, potassium titanate, alumina, aluminum nitride, boron nitride, mullite. The reflective member 20 can reflect or transmit in varying amount of light depending on the concentration or the density of the light reflecting substance contained therein. Thus, the concentration and the density can be suitably adjusted in accordance with the shape and size of the light emitting device 100. Furthermore, forming the reflective member 20 with a material that has heat dissipation properties in addition to light reflecting properties can increase heat dissipation at the same time. Examples of such materials include aluminum nitride and boron nitride which have high thermal conductivity.

Mounting Base

The mounting base 40 mounts at least one light emitting element 30, and electrically connects the light emitting device 100 with an external power supply. The mounting base 40 is configured with a plate-like support member and conductive wiring patterns disposed on the surface of and/or in the support member. The structure of the mounting base 40, including the shapes and sizes of the electrodes, is set in accordance with the structures and sizes of the electrodes of the light emitting element 30. On the lower face of the mounting base 40, a heat dissipation terminal which is electrically independent from the light emitting element 30 can be provided. It is preferable to form the heat dissipation terminal to have an area larger than the sum of the upper face areas of all light emitting elements 30 included in the light emitting device 100, and is disposed to overlap the areas directly under the light emitting elements 30. Such a structure of the heat dissipation terminal can provide the light emitting device 100 with good heat dissipation.

For the support member of the mounting base 40, it is preferable to use an insulating material that does not readily transmit the emitted light from the light emitting element 30 or external light. The mounting base 40 is preferably formed with a material having a certain degree of strength. Specific examples of such materials include ceramics such as alumina, aluminum nitride, and mullite, and resins such as phenol resins, epoxy resins, polyimide resins, bismaleimide triazine BT resins, and polyphthalamide (PPA). The support member may have a structure that includes a cavity. This simplifies the formation of the reflective member 20 by allowing the material of the reflective member 20 to be dripped and cured.

The conductive wiring and the heat dissipation terminal can be formed by using, for example, metals such as Cu, Ag, Au, Al, Pt, Ti, W, Pd, Fe, and Ni, or an alloy containing these elements. Such conductive wiring can be formed by electroplating, electroless plating, vapor deposition, sputtering, or the like.

The light emitting device 100 has the structure explained above, which allows the light emitted from the light emitting element 30 to travel a long distance when used for a headlight for motorcycles, automobiles, ships, airplanes, or the like, for example. In other words, as shown in FIG. 4, when light is emitted from one or more light emitting elements 30 in the light emitting device 100, some of the light propagates through the light transmissive member 10 without being reflected by the reflective member 20 directly towards the upper face 3 of the second light transmissive member 2, and some other light exits from the upper face 3 of the second light transmissive member 2 after being reflected by the reflective member 20. In the light emitting device 100, moreover, by setting the lower face 7 of the first light transmissive member to have a larger area than the sum of the upper face areas of the light emitting elements 30, the emitted light from the light emitting elements 30 can be received with a minimum loss. At the same time, the upper face 3 of the second light transmissive member has a smaller area than the sum of the upper face areas of the light emitting elements 30. The upper face 3 of the second light transmissive member also has a smaller area than the lower face 7 of the first light transmissive member. Accordingly, the light emitted from the light emitting elements 30 is concentrated by the light transmissive member 10 onto the upper face 3 of the second light transmissive member. This can realize a high luminance light emitting device 100 suited for high beam headlights whose emission light can reach a region over a long distance. In FIG. 4, representative traveling directions of light are schematically shown using arrows.

Method for Manufacturing Light Emitting Device

The manufacturing method S10 for the light emitting device 100 shown by the flowchart in FIG. 6 will be explained primarily with reference to FIGS. 5A-5H.

Light Transmissive Member Block Preparation Step S11

Figure 5A:
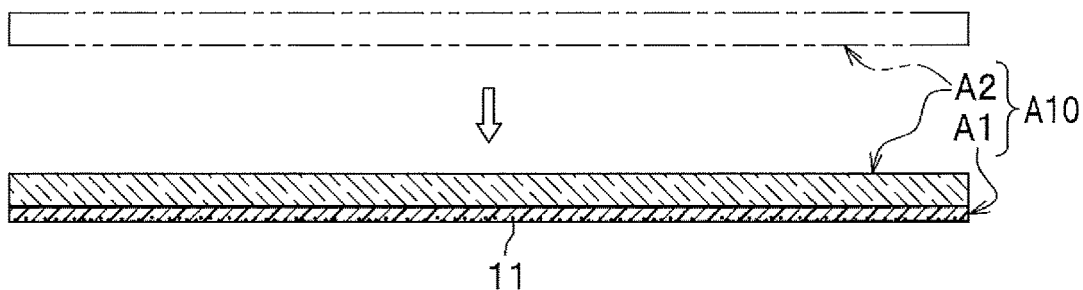
FIG. 5A is an explanatory diagram schematically showing the light transmissive member block in which a first light transmissive member block and a second light transmissive member block are bonded together in a method for manufacturing the light emitting device according to one embodiment.

As shown in FIG. 5A, a plate-like light transmissive member block A10 is provided by bonding the upper face of a first light transmissive member block A1 to the lower face of a second light transmissive member block A2. The first light transmissive member block A1 has a plate-like shape formed with resin material containing at least one phosphor. The second light transmissive member block A2 is formed with a material harder than the first light transmissive member block A1. The first light transmissive member block A1 is a phosphor-containing resin layer, which contains a phosphor 11 capable of wavelength conversion of some of the light from the light emitting element 30. The second light transmissive member block A2 is glass which is formed or processed into a plate like. For example, the light transmissive member block A10 can be formed by printing a phosphor-containing resin layer on the lower face of a glass plate. The first light transmissive member block A1 may be bonded to the lower surface of the second light transmissive member block A2 via another member such as a bonding material, instead of being directly bonded thereto. Examples of the joining method include crimping, fusing, sintering, adhesion using an organic bonding material, and adhesion using an inorganic bonding material such as low melting point glass. The first light transmissive member block A1 can be formed by using a printing, compression molding, phosphor electrodeposition, joining with phosphor sheet, or other technique. In the case of a printing method, a phosphor layer is formed by preparing a paste containing a phosphor, binder, and solvent, coating the lower face of the second light transmissive member block 2A with the past, and drying.

The first light transmissive member block A1 and the second light transmissive member block A2 undergo the steps described below to be formed into light transmissive members 10 each equipped with a first light transmissive member 1 and a second light transmissive member 2. The lower face of the first transmissive member block A1 forms the lower faces of the light transmissive members 10, and upper face of the second light transmissive member block A2 forms the upper faces of the light transmissive members 10.

Groove Forming Step S12

Figure 5B:
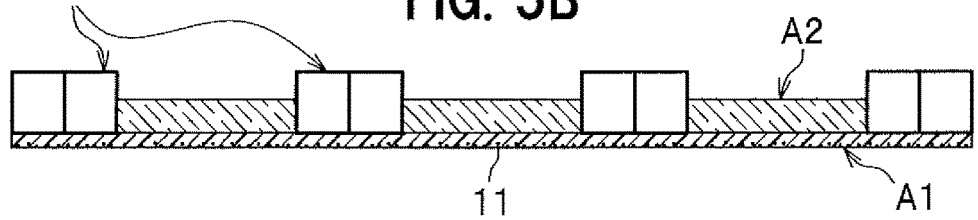
FIG. 5B is an explanatory diagram schematically showing grooves being formed on the upper face of the second light transmissive member block in the method for manufacturing the light emitting device according to the embodiment.
Figure 5C:
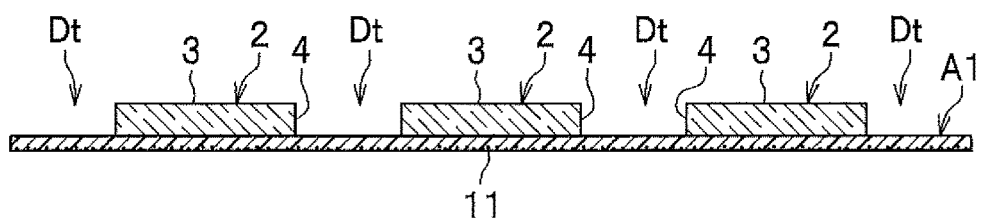
FIG. 5C is an explanatory diagram schematically showing the grooves on the upper face of the second light transmissive member block formed in the method for manufacturing the light emitting device according to the embodiment.

Subsequently, as shown in FIGS. 5B and 5C, grooves Dt are formed on the upper face of the second light transmissive member A2 in the light transmissive member block A10 by using a blade Br1 of a machine tool. The grooves Dt may go through the second light transmissive member block A2 to reach the first transmissive member block A1, but is not required to reach it. In the present embodiment, the grooves Dt are formed to reach the first light transmissive member block A1, such that the first light transmissive member block A1 is exposed at the bottom of each groove Dt. Furthermore, the grooves Dt formed in this step form the lateral faces 4 of the second light transmissive members in the light transmissive members 10. In the step of forming the grooves Dt, the second light transmissive member block A2 is machined such that each upper surface of the second light transmissive members is formed to have a rectangular shape smaller than the upper face 31 of the light emitting element 30. The second light transmissive member 2 is formed with a harder material than the first light transmissive member 1, which facilitates machining using the blade Br1, for example, it won't be destructed as in the case of a highly viscous material such as a resin, resulting in sharp corners for the rectangles. The grooves Dt may be formed by other known methods, such as laser machining.

It is preferable to use a material having a hardness on the Mohs scale of, for example, from 3 to 10 for the second light transmissive member block A2. The hardness in this range can reduce the likelihood of destructing corners during machining.

Light Transmissive Member Forming Step S13

Figure 5D:
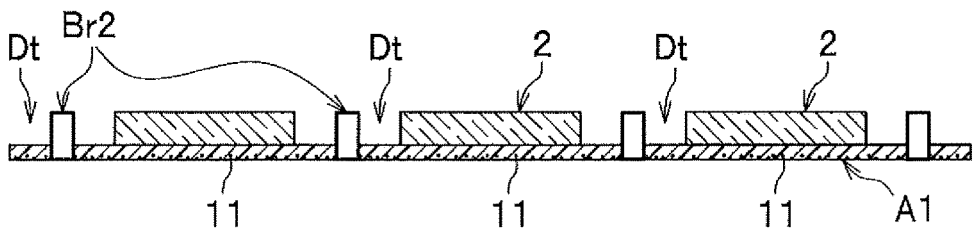
FIG. 5D is an explanatory diagram schematically showing the first light transmissive member block being cut at the grooves formed in the method for manufacturing the light emitting device according to the embodiment.
Figure 5E:
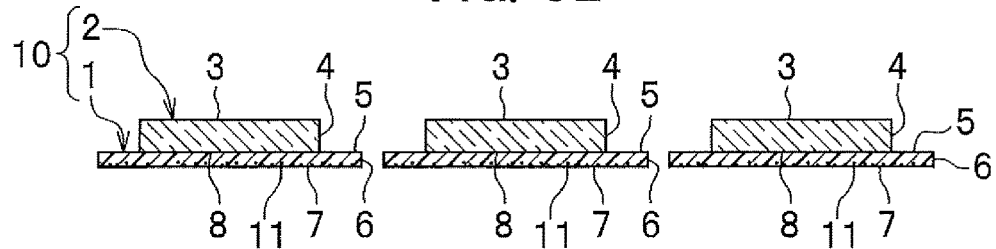
FIG. 5E is an explanatory diagram schematically showing the light transmissive members after being separated into individual pieces in the method for manufacturing the light emitting device according to the embodiment.

As shown in FIGS. 5D and 5E, the light transmissive member block A10 is divided at the grooves Dt into individual light transmissive members 10 each having a first light transmissive member 1 and a second light transmissive member 2. When divided, a plurality of light transmissive members 10 where the lower face 7 of each first light transmissive member 1 has a larger area than the upper face of the light emitting element 30 are obtained. In this step, the first light transmissive member block A1 is cut at the grooves Dt into individual light transmissive members 10 by using a blade Br2 having a narrower width than that used in creating the grooves Dt. The area inside the perimeter of the lower face 7 of a first light transmissive member when divided into a light transmissive member 10 is larger than the sum of the areas of the upper faces 31 of one or more light emitting elements 30 installed in a light emitting device 100. Each light transmissive member 10 thus obtained has a protrusion, and the upper face 3 of the second light transmissive member is smaller than the lower face 7 of the first light transmissive member. The cut surfaces of the first light transmissive member block A1 form the lateral faces 6 of the first light transmissive member, and the grooves Dt form the lateral faces 4 of the second light transmissive member in a light transmissive member 10. The lateral faces 6 of the first light transmissive member are located outside the lateral faces 4 of the second light transmissive member in a plan view.

The first transmissive member block A1 is formed with a resin material, therefore, it is more flexible and less susceptible to damages compared to one formed with a glass material. In other words, it won't be readily cracked or chipped when being divided into individual pieces, the first light transmissive member can be formed with a reduced thickness.

For the first light transmissive member block A1, it is preferable to use a material having a Shore hardness of, for example, from A30 to D50 after cured. The hardness in this range allows for the light emitting device 100 to maintain the strength during use, as well as reducing damages such as cracking and chipping during manufacturing or use.

Furthermore, in the case where the phosphor 11 is localized on the lower face side of the first light transmissive members 1 in the first light transmissive member block A1, in other words, the faces opposite the faces bonded to the second light transmissive member block A2, the area on the upper face side where the phosphor is not substantially present can be exposed at the bottoms of the grooves Dt when the grooves Dt reach the first light transmissive member block A1 in the groove forming step S12 discussed above. In other words, even if the grooves Dt reach the first light transmissive member block A1 in forming the grooves, the amount of the phosphor contained in the first light transmissive member block A1 would not change. This can attenuate color shift or color non-uniformity attributable to a decline of the phosphor content.

Mounting Base and Light Emitting Element Preparation Step

A light emitting element 30 and a mounting base 40 are separately provided. The light emitting element 30 and the mounting base 40 can be provided any time before the step of bonding the light transmissive member 10.

The mounting base 40 is formed to a rectangular plate shape in a plan view, and is provided with, for example, a conductive wiring pattern and a heat dissipation terminal on the support member. In the present embodiment, the mounting base 40 may include a cathode mark at one corner of the upper face of the mounting base using the same material as that for the electrodes, which are the conductive wiring.

At least one light emitting element 30 is mounted on the mounting base 40. Here, a single light emitting element 30 per light emitting device 100 is mounted on the conductive wiring of the mounting base 40 via bonding members such as bumps or the like.

Light Transmissive Member Bonding Step S14

Figure 5F:
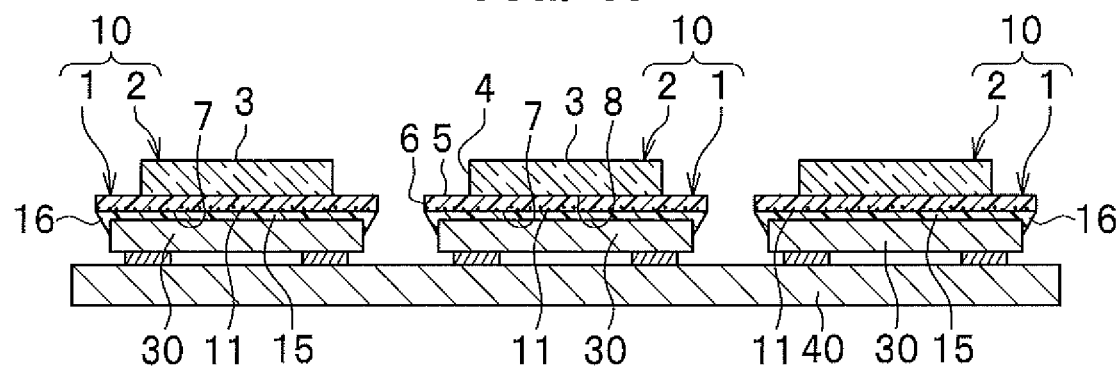
FIG. 5F is an explanatory diagram schematically showing the light emitting elements and the light transmissive members bonded together in the method for manufacturing the light emitting device according to the embodiment.

As shown in FIG. 5F, the lower face of the light transmissive member 10 and the upper face 31 of the light emitting element 30 are bonded together such that the lower face perimeter of the first light transmissive member 1 in the light transmissive member 10 is positioned outside the perimeter of the upper face 31 of the light emitting element 30.

In the present embodiment, the light emitting element 30 and the first light transmissive member 1 are bonded using a bonding material 15. In bonding using a bonding material 15, the bonding material 15 is dripped on the upper face 31 of the light emitting element 30, followed by placing the light transmissive member 10 on the bonding material 15. The dripped bonding material 15 is pressed down by the light transmissive member 10, wetting and spreading onto the lateral faces of the light emitting element 30 to form fillets 16 between the lateral faces of the light emitting element 30 and the lower face of the light transmissive member 10. The amount and the viscosity of the bonding material 15 to be dripped can be suitably adjusted in such a manner as to form the fillets 16 on the lateral faces of the light emitting element 30, but not wet and spread to the mounting base 40.

The lower face 7 of the first light transmissive member in the light transmissive member 10 is bonded to the light emitting element 30 via the bonding material 15 disposed on the upper face of the light emitting element 30. It is preferable to form the light transmissive member 10 such that the area of the lower face 7 of the first light transmissive member is larger than the sum of the areas of the upper faces 31 of one or more light emitting elements 30, and the light transmissive member is placed such that the distances from the lateral faces of the light emitting element 30 to the perimeter of the lower face 7 of the first light transmissive member are substantially equal. The light transmissive member 10 is preferably arranged such that the center of the upper face 3 of the second light transmissive member substantially overlaps the center of one or more light emitting elements 30 as a whole which are orderly arranged to form an overall rectangular shape in a plan view. The light transmissive member 10 bonded to the light emitting elements 30 includes a first light transmissive member whose lower face 7 is larger than the sum of the upper faces 31 of the light emitting elements 30. Accordingly, the light transmissive member 10 has a structure allowing the light emitted from the upper faces 31 of the light emitting elements 30 to take into the lower face 7 of the first light transmissive member which has a larger area than the upper faces 31, and guiding the light towards the upper face 3 of the second light transmissive member which has a smaller area than the upper faces 31 of the light emitting elements 30.

Reflective Member Supplying Step S15

Figure 5G:
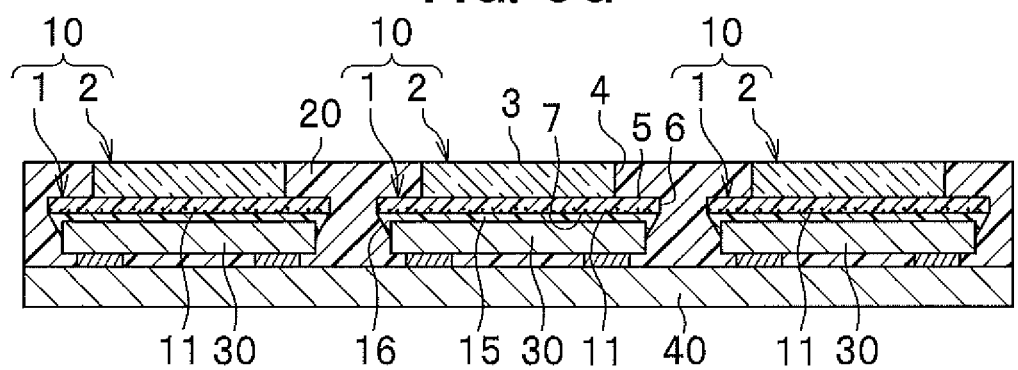
FIG. 5G is an explanatory diagram schematically showing a reflective member disposed in the surrounding of the light emitting elements and the light transmissive members in the method for manufacturing the light emitting device according to the embodiment.

Subsequently, as shown in FIG. 5G, a reflective member 20 which covers the light emitting element 30, the light transmissive member 10, and the mounting base 40 is disposed. The light emitting device 100 may have a reflective member 20 composed of one or more types of materials. What follows is an example in which a two-layer reflective member 20 is formed.

First Reflective Member Supplying Step

A reflective member 20 is supplied between the light emitting element 30 and the mounting base 40, and up to the height that covers the light emitting element 30 and the bonding material 15 on the lateral faces of the light emitting element 30. It is preferable to use a material having a low linear expansion coefficient for the reflective member 20 if disposed between the light emitting element 30 and the mounting base 40. This can attenuate the heat stress at the bonded locations between the light emitting element 30 and the mounting base 40.

Second Reflective Member Supplying Step

Subsequently, a reflective member 20 that is to cover the lateral faces of the light transmissive member 10 is supplied. The reflective member 20 covers the lateral faces 4 of the second light transmissive member, the upper face 5 and the lateral faces 6 of the first light transmissive member. At this point, it is preferable to drip the reflective member 20 on the upper face of the mounting base 40 distant from the light transmissive member 10 such that the upper face 3 of the second light transmissive member is exposed from the reflective member 20. The reflective member 20 is supplied to cover the surface of the reflective member 20 supplied earlier.

For the reflective member 20 here, a silicone resin containing titanium oxide is used by way of example.

Dividing Step S16

Figure 5H:
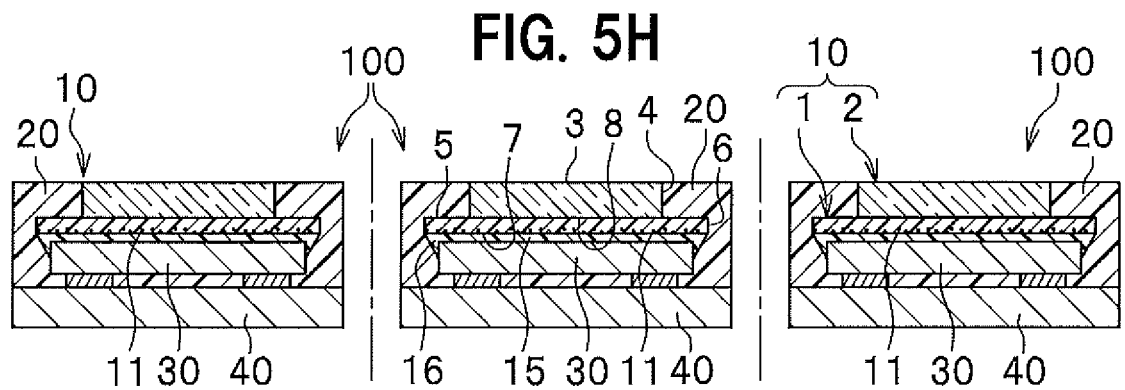
FIG. 5H is an explanatory diagram schematically showing the light emitting devices separated into individual pieces in the method for manufacturing the light emitting device according to the embodiment.

As shown in FIG. 5H, after forming the reflective member 20, the mounting base 40 is cut into individual light emitting device units by laser irradiation or using tools such as blades to form the light emitting devices 100. The light emitting device 100 manufactured by the steps described above allows the light emitted from one or more light emitting elements 30 to enter from the lower face 7 of the first light transmissive member which has a larger area than the sum of the areas of the upper faces 31 of the light emitting elements 30, and be externally released as high intensity light from the upper face 3 of the second light transmissive member which has a smaller area than the lower face 7 of the first light transmissive member. Moreover, the first light transmissive member 1 formed with a resin material is less susceptible to damages due to cracking during the manufacturing process even if the difference in the areas between the first light transmissive member 1 and the second light transmissive member 2 is increased, thereby increasing the production yield. The second light transmissive member formed with a glass material makes the emission face of the light emitting device 100 less susceptible to degradation, thereby achieving high product quality.

Variations

The light emitting device 100 may be configured with a plurality of light emitting elements 30, and the light transmissive member 10 may be shaped in various ways. For example, as shown in FIG. 7, FIG. 8, and FIGS. 9A-9D, a light emitting element group 30A or 30B which is configured with a plurality of light emitting elements may be provided as in the case of a light emitting device 100A or 100B, and a light transmissive member may have oblique lateral parts as in the case of light transmissive member 10A, 10B, or 10C. Each of these components will be explained below. The components and the manufacturing methods already explained as the light emitting device 100 will refer to the same reference numerals, hence the explanations therefor will be omitted when appropriate.

Figure 7:
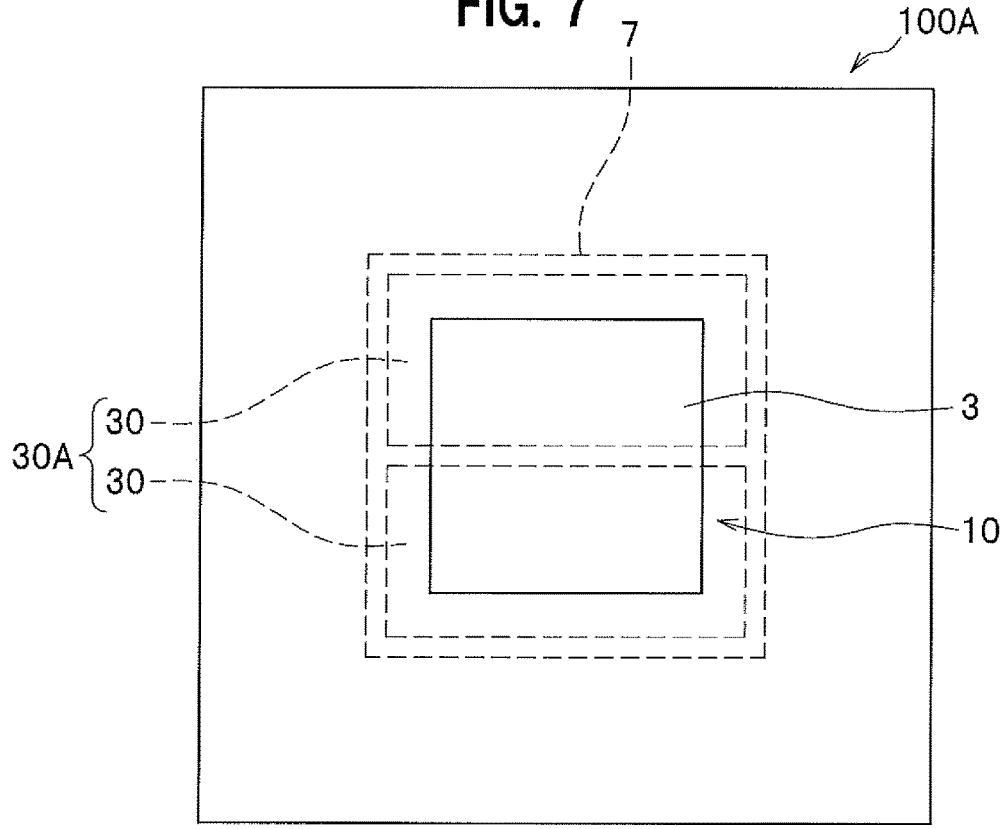
FIG. 7 is a schematic plan view of a light emitting device representing a variation of the embodiment.

In the light emitting device 100A, a plurality of light emitting elements 30 may be arranged as a light emitting element group 30A. As shown in FIG. 7, for example, two same size light emitting elements 30 are arranged adjacent to one another in a light emitting element group 30A. When the light emitting elements 30 are adjacent to one another, the lower face 7 of the first light transmissive member of the light transmissive member 10 is formed to be larger than the total area of the two light emitting elements 30 arranged side by side. The area of the light emitting element group 30A is the rectangular area enclosing the outer perimeters of the two light emitting elements 30 with straight lines in which the area between the light emitting elements is configured as part of the upper face area of the light emitting element group 30A. The light transmissive member 10 includes a second light transmissive member whose upper face 3 has a smaller area than the area of the light emitting element group 30A. The light emitting device 100A configured as above allows the light from the plurality of light emitting elements 30 to enter from the lower face 7 of the first light transmissive member, and be externally released from the upper face 3 of the second light transmissive member which has smaller area than the lower face 7 of the first light transmissive member. Thus, the light emitting device can release higher intensity light that travels a longer distance.

Figure 8:
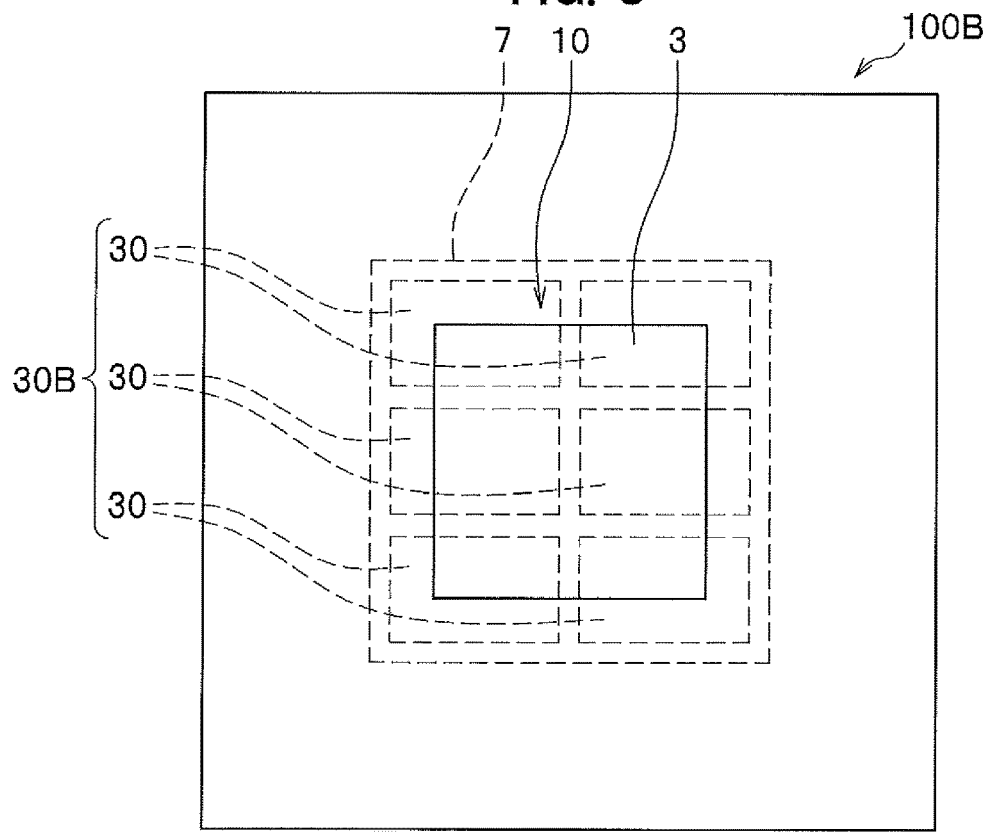
FIG. 8 is a schematic plan view of a light emitting device representing another variation of the embodiment.

Another example shown in FIG. 8 has six light emitting elements 30 orderly arranged as a light emitting element group 30B. The light transmissive member 10 is formed such that the lower face 7 of the first light transmissive member has larger area than that of the light emitting element group 30B, which is the total area of the array of the six light emitting elements 30. The area of the light emitting element group 30B is the rectangular area enclosing the outer perimeters of the six light emitting elements 30 using straight lines in which the areas between the light emitting elements is configured as part of the upper face area of the light emitting element group 30B. Furthermore, the light transmissive member 10 is formed such that the upper face 3 of the second light transmissive member has smaller area than that of the light emitting element group 30B. The light emitting device 100B configured as above can also allow the light from the plurality of light emitting elements 30 to enter from the lower face 7 of the first light transmissive member, and be externally released from the upper face 3 of the second light transmissive member which has smaller area than that of the lower face 7 of the first light transmissive member. Thus, the light emitting device can release higher intensity light that travels a longer distance.

Figure 9A:
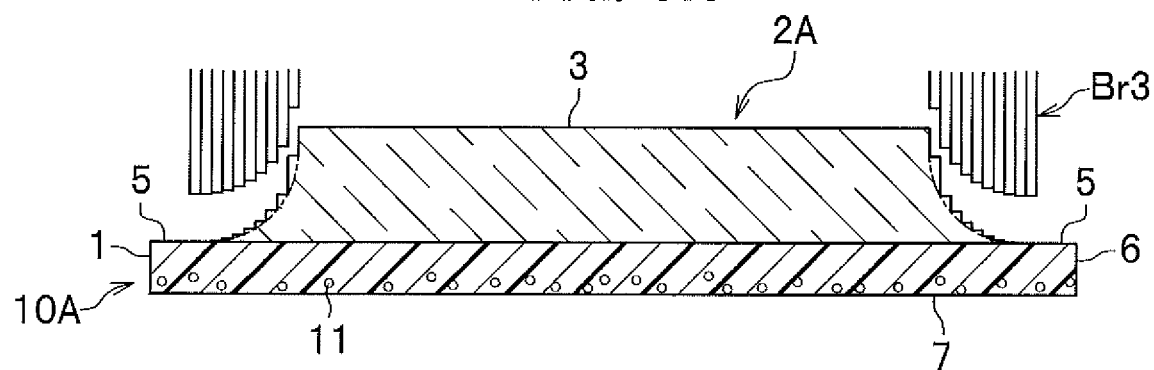
FIG. 9A is an explanatory diagram of a manufacturing step showing a variation of the light transmissive member in the light emitting device according to the embodiment.
Figure 9B:
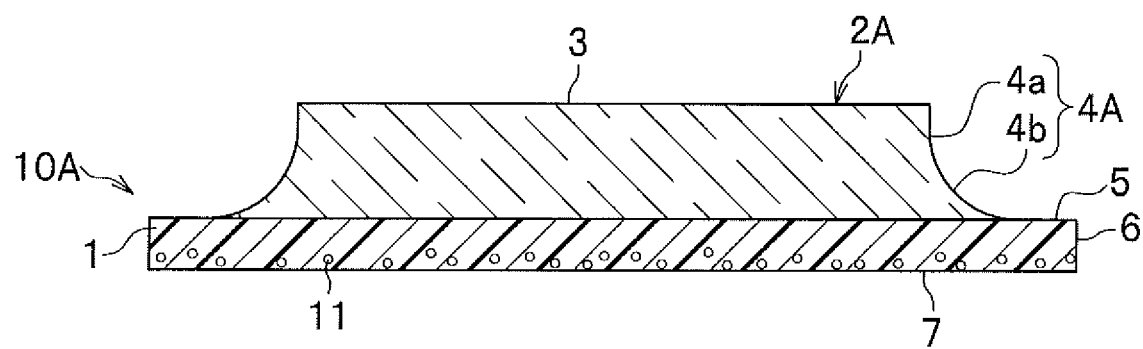
FIG. 9B is a cross-sectional view of a variation of the light transmissive member in the light emitting device according to the embodiment.

As shown in FIG. 9B, the lateral faces 4A of the second light transmissive member may each include a perpendicular part 4a and an oblique part 4b. The lateral faces 4A of the second light transmissive member each have a perpendicular part 4a which continues from and substantially perpendicularly to a direction of the upper face 3 of the second light transmissive member. The lateral faces 4A of the second light transmissive member also each have an oblique part 4b which continues from the perpendicular part 4a and across the upper face 5 of the first light transmissive member. The oblique part 4b is formed to flare from the upper face side to the lower face side. The oblique part 4b, moreover, is a curved surface that is inwardly convex and continues from the perpendicular part 4a and across the upper face 5 of the first light transmissive member. By having the oblique parts 4b, the second light transmissive member can efficiently guide the light from the light emitting elements 30 towards the upper face 3 of the second light transmissive member with a reduced number of reflection, thereby providing a highly luminous light emitting device. The oblique parts 4b, moreover, allow the lower face 8 of the second light transmissive member and the upper face 5 of the first light transmissive member to have the same shape. This allows the second light transmissive member to support the first light transmissive member 1 made of a resin across a broader area, thereby increasing the structural strength of the light transmissive member 10A.

The light emitting device 100 includes at least one light emitting element 30, and the number of light emitting elements can be two or six as described earlier, or three, four, five or seven or even more.

As shown in FIG. 9A, the oblique parts 4b can be formed by using a blade Br3 which is used for forming the grooves Dt shown in FIG. 5C. The blade Br3 has a narrower width than the blade Br2 shown in FIG. 5D, and is operated while changing the penetration depth to provide a groove Dt with a perpendicular part 4a and an oblique part 4b. The lateral faces 4A having a perpendicular part 4a and an oblique part 4b are formed in this manner. Alternatively, the grooves Dt having an oblique part may be formed by using a blade for making bevels. The oblique part 4b is shown as a curved line in the cross section, but can be formed as a straight line.

Furthermore, changing the shape, the penetration depth, or the like of the blade Br3 for forming the grooves Dt can create a light transmissive member 10B or 10C in which the first light transmissive member and the second light transmissive member have differently shaped lateral faces.

Figure 9C:
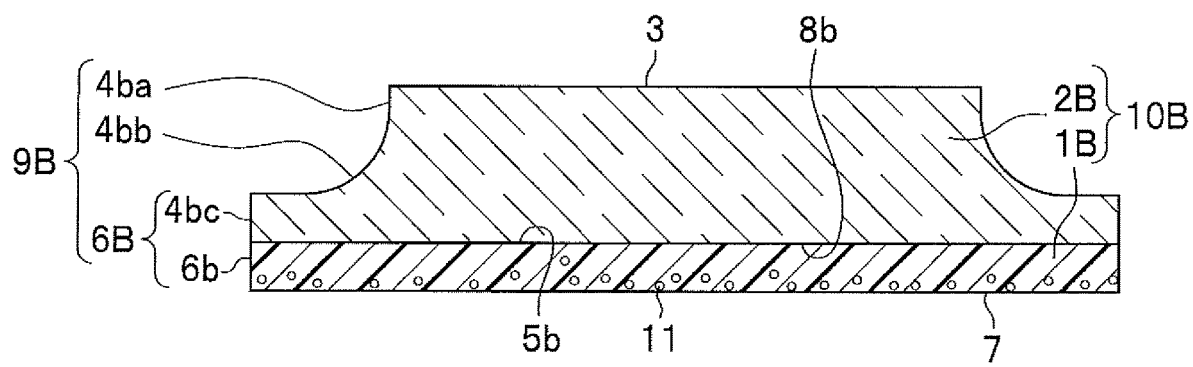
FIG. 9C is a cross-sectional view schematically showing a variation of the location where the first light transmissive member and the second light transmissive member are defined in the light emitting device according to the embodiment.

As shown in FIG. 9C, the lateral faces 9B of the light transmissive member 10B each have an oblique part 4bb. The light transmissive member 10B, similar to the light transmissive member 10A, has the first light transmissive member 1B and the second light transmissive member 2B that are integrally formed. The first light transmissive member 1B and the second light transmissive member 2B each have an upper face and a lower face, and the upper face 5b of the first light transmissive member and the lower face 8b of the second light transmissive member are bonded together to configure the light transmissive member 10B. Similar to the light transmissive member 10 or the like described earlier, the light transmissive member 10B allows the light from the light emitting element 30 to enter from the lower face 7 of the first light transmissive member, and be externally released from the upper face 3 of the second light transmissive member.

Similar to the light transmissive member 10 discussed earlier, the light transmissive member 10B has a lower face 7, an upper face 3 having a smaller area than the lower face 7, and lateral faces 9B.

Each of the lateral faces 9B of the light transmissive member 10B has a first perpendicular parts 6B, an oblique part 4bb, and a second perpendicular part 4ba, in that order from the lower face side. The first perpendicular parts 6B is a part which continues from and substantially perpendicular to the lower face 7, consisting of a lateral face 6b of the first light transmissive member 1B and a perpendicular part 4bc which is part of the lateral face of the second light transmissive member 2B. The second perpendicular part 4ba is a part that continues from and substantially perpendicular to the upper face 3. The oblique part 4bb is positioned between the first perpendicular parts 6B and the second perpendicular part 4ba, and is oblique in such a manner as to flare from the upper face side to the lower face side. The oblique part 4bb is a curved face that protrudes inward.

The interface between the first light transmissive member 1B and the second light transmissive member 2B, which is the bonding face between the first light transmissive member 1B and the second light transmissive member 2B, of the light transmissive member 10B is substantially in parallel to the lower face 7 and in contact with the first perpendicular parts 6B.

In the light transmissive member 10B, the lateral faces of the second light transmissive member 2B each have a perpendicular lateral face 4ba, which is the second perpendicular lateral face of the light transmissive member 10B, that continues from the upper face 3 of the second light transmissive member 2B, an oblique part 4bb, which is the lateral face of the light transmissive member 10B, that continues from the perpendicular lateral face 4ba while flaring from the upper face side to the lower face side, and a perpendicular lateral face 4bc, which is part of the perpendicularlateral face 6B of the light transmissive member 10B, that continues from the oblique part 4bb, and connects and is substantially perpendicular to the lower face of the second light transmissive member.

Furthermore, the lateral faces 6b of the first light transmissive member 1B continue from the second light transmissive member 2B. The lateral faces 6b of the first light transmissive member 1B serves as one of the first perpendicular parts 6B of the light transmissive member 10B such that the first perpendicular parts 6B is configured together with the perpendicular part 4bc of the second light transmissive member 2B. In other words, the upper face perimeter of the first light transmissive member 1B in the light transmissive member 10B substantially coincides with the lower face perimeter of the second light transmissive member 2B in a plan view.

Such a shape allows for a further reduction of the thickness of the first light transmissive member 1B formed with a resin material containing a phosphor 11. Moreover, for securely supporting the phosphor-containing resin layer with reduced thickness, and ease of machining, the thinnest part of the second light transmissive member 2B has preferably substantially the same as or larger thickness than that of the thinnest part of the first light transmissive member 1B.

Figure 9D:
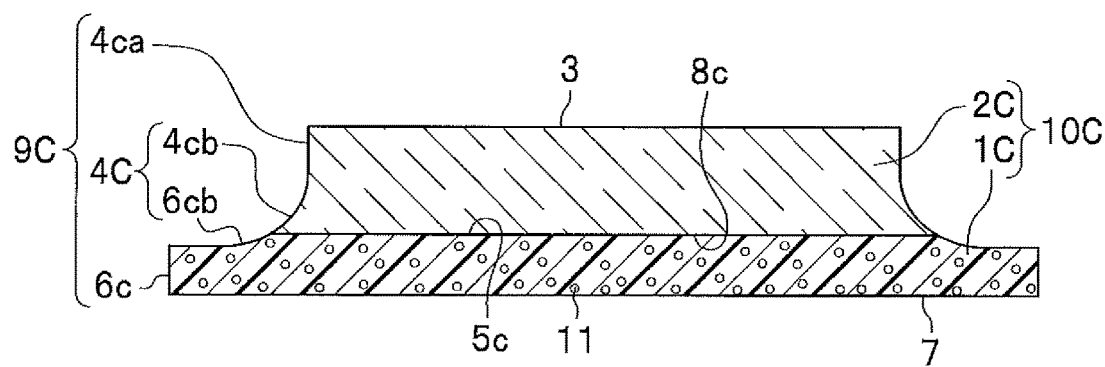
FIG. 9D is a cross-sectional view schematically showing another variation of the location where the first light transmissive member and the second light transmissive member are defined in the light emitting device according to the embodiment.

The lateral faces 9C of the light transmissive member 10C, as shown in FIG. 9D, each have an oblique parts 4C. Similar to the light transmissive member 10A, a first light transmissive member 1C and a second transmissive member 2C integrally form the light transmissive member 10C. The first light transmissive member 1C and the second light transmissive member 2C each have an upper face and a lower face, and the upper face 5c of the first light transmissive member and the lower face 8c of the second light transmissive member are bonded together to configure the light transmissive member 10C. The light transmissive member 10C also allows the light from the light emitting element 30 to enter from the lower face 7 of the first light transmissive member and be externally released from the upper face 3 of the second light transmissive member in a similar manner to that in the case of the light transmissive member 10 or the like described earlier.

The light transmissive member 10C, similar to the light transmissive member 10 discussed earlier, has a lower face 7, an upper face 3 having a smaller area than the lower face 7, and lateral faces 9C.

As a lateral face 9C, the light transmissive member 10C has a first perpendicular lateral part 6c, an oblique parts 4C, and a second perpendicular lateral part 4ca in that order from the lower face side. The first perpendicular lateral part 6c is a part that continues from and is substantially perpendicular to the lower face 7, and the second perpendicular lateral part 4ca is a part that continues and is substantially perpendicular to the upper face 3. The oblique parts 4C is positioned between the first perpendicular lateral part 6c and the second perpendicular lateral face 4ca, and is oblique in such a manner as to spread out from the upper face side to the lower face side. The oblique parts 4C is a curved face that protrudes inward. The oblique parts 4C is formed across the first light transmissive member 1C and the second light transmissive member 2C, consisting of an oblique lateral part 6cb and an oblique lateral part 4cb.

The interface between the first light transmissive member 1C and the second light transmissive member 2C in the light transmissive member 10C is substantially in parallel to the lower face 7 and in contact with the oblique parts 4C.

The lateral faces of the second light transmissive member 2C in the light transmissive member 10C each have a perpendicular lateral part 4ca that continues from the upper face 3 of the second light transmissive member 2C. The perpendicular lateral part 4ca of the second light transmissive member 2C can be referred to as the second perpendicular lateral part of the light transmissive member 10C. Each of the perpendicular lateral part 4ca continues to an oblique lateral part 4cb which spread out from the upper face side to the lower face side. The oblique lateral part 4cb can be referred to as the oblique lateral part of the light transmissive member 10C. The oblique lateral parts 4cb connect to the lower face 8c of the second light transmissive member, and continue to the oblique lateral parts 6cb of the first light transmissive member 1C. The lateral faces of the first light transmissive member 1C each have an oblique lateral part 6cb and the first perpendicular lateral part 6c. The perpendicular lateral part 6cb continues from the second light transmissive member 2C while spreading out from the upper face side to the lower face side. The perpendicular lateral part 6cb can be referred to as part of the oblique lateral part 4C of the light transmissive member 10C. The first perpendicular lateral part 6c continues from the oblique lateral part 6cb while connecting and being substantially perpendicular to the lower face 7 of the first light transmissive member 1C.

In other words, in the light transmissive member 10C, the upper face perimeter of the first light transmissive member 1C substantially coincides with the lower face perimeter of the second light transmissive member 2C in a plan view.

Such a shape can increase the percentage of the thickness of the first light transmissive member 1C in the light transmissive member 10C, and it is therefore effective in the case, for example, of requiring a larger amount of the phosphor 11 to achieve a given emission color.

In the first light transmissive member 1B and the second light transmissive member 2B of the light transmissive member 10B, and the first light transmissive member 1C and the second light transmissive member 2C of the light transmissive member 10C, their thicknesses can suitably be adjusted to form the lateral faces 9B and the lateral faces 9C, respectively, as compared to the light transmissive member 10.

Furthermore, in the light transmissive member 10B, the oblique parts 4bb and the first perpendicular lateral parts 6B may be continuous, or have a plane between them which is substantially in parallel to the upper face 3. In the case where the oblique parts 4bb each have a tangent that is substantially perpendicular to the upper face 3 in the vicinity of the upper face of the light transmissive member 10B, the construction may be such that the oblique parts 4bb include these regions as the second perpendicular parts 4ba.

Similarly, in the light transmissive member 10C, the oblique parts 4C and the first perpendicular lateral part 6c may be continuous, or have a plane between them which is substantially in parallel to the upper face 3. In the case where the oblique parts 4C have tangents that are substantially perpendicular to the upper face 3 in the vicinity of the upper face of the light transmissive member 10C, the structure may be such that the oblique parts 4C include these regions as the second perpendicular lateral parts 4ca.

Figure 10A:
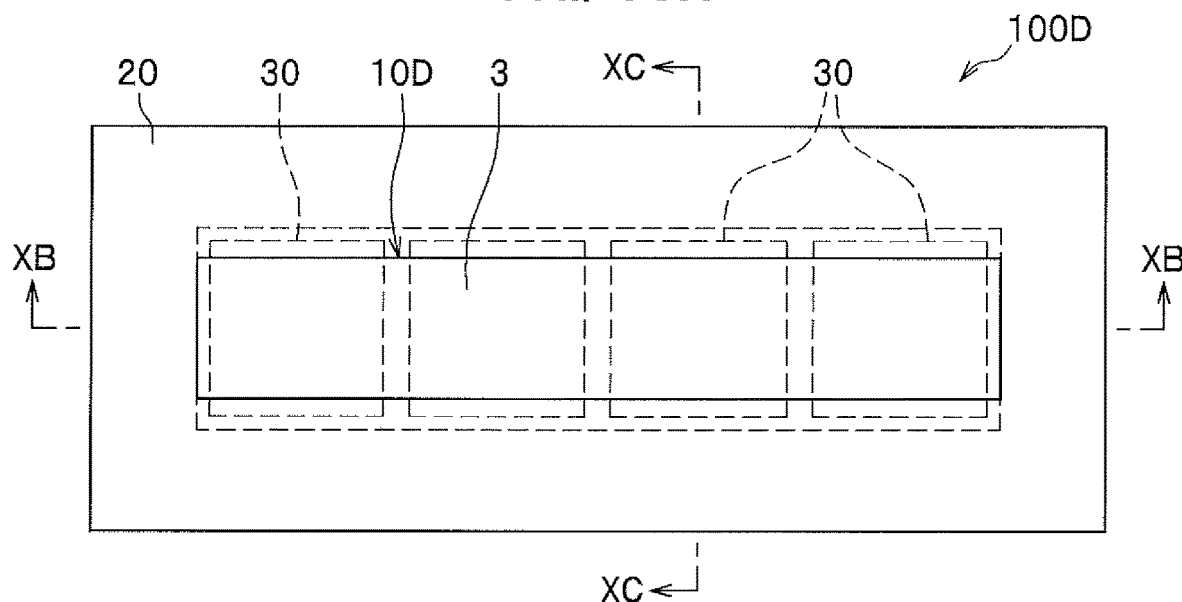
FIG. 10A is a schematic plan view showing the positional relationship between the light transmissive members and the light emitting elements in the light emitting devices according to the embodiment.
Figure 10B:
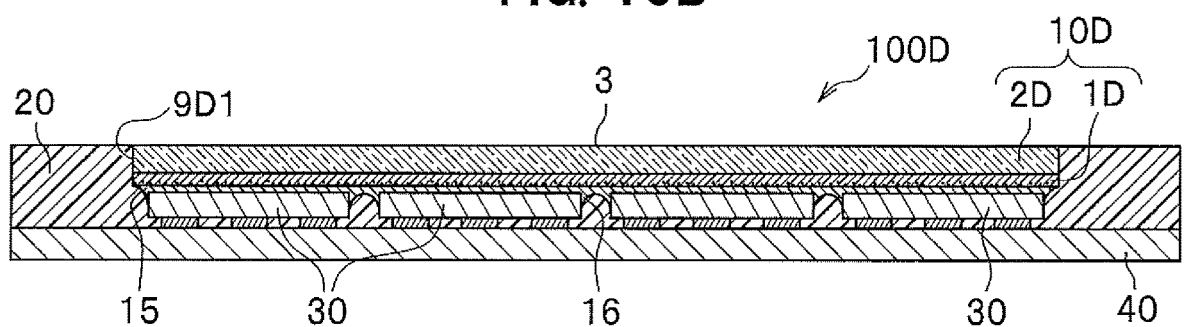
FIG. 10B is an enlarged cross-sectional view of the device shown in FIG. 10A taken along line XB-XB.
Figure 10C:
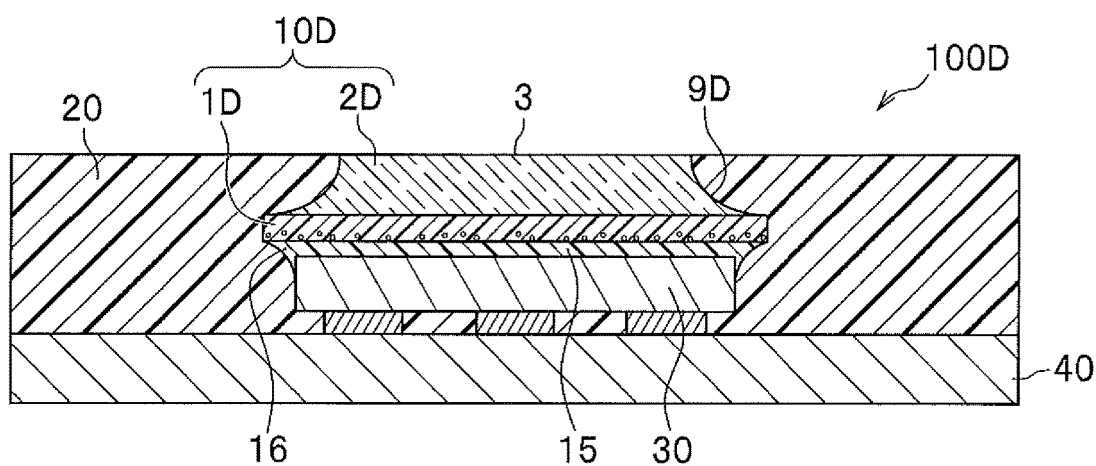
FIG. 10C is an enlarged cross-sectional view of the device shown in FIG. 10A taken along line XC-XC.

Furthermore, the light transmissive member 10, 10A, 10B, or 10C may have a similar structure to that of the light transmissive member 10D shown in FIGS. 10A-10C. Two of the four lateral faces of the light transmissive member 10D are perpendicular lateral parts 9D1 which continues to the upper face and the lower face. In other words, in the light transmissive member 10D, the upper face perimeter of the second light transmissive member 2D partly coincides with the lower face perimeter of the first light transmissive member 1D while the rest of part is positioned inside the lower face perimeter of the first light transmissive member 1D, in a plan view.

Making the lower face area of the first light transmissive member 1D larger, and the upper face area of the second light transmissive member 2D smaller, than the sum of the upper face areas of the light emitting elements 30 enables such a light emitting device 100D to also achieve higher luminance. In the light emitting device 100D, the light transmissive member 10D includes lateral faces 9D each having an oblique parts 9D along the long side, and perpendicular lateral parts 9D1 along the short side, of the orderly arranged light emitting elements 30. In other words, the perpendicular lateral parts 9D1, as part of the upper face perimeter of the second light transmissive member 2D, are the parts that coincide with the lower face perimeter of the first light transmissive member 1D, in a plan view. Together with those disposed along the short sides, the long sides of the first light transmissive member 1D may be configured with a perpendicular lateral parts 9D1. The perpendicular lateral parts 9D1 may constitute any one side, or a plurality of perpendicular lateral parts 9D1 may constitute two adjacent sides, or three continuous sides of the rectangular shape in a plan view.

In the light emitting devices 100, 100A, and 100B described above, it was explained that the lower faces of the second light transmissive members have different sizes from the upper faces of the first light transmissive members. However, similar to that shown in FIG. 9C, the light transmissive member may be configured such that the lower face 8 of the second light transmissive member and the upper face 5 of the first light transmissive member have the same size, and the upper face 3 of the second light transmissive member is positioned inside the upper face 5 of the first light transmissive member. This structure allows for the light to be more readily guided from the upper face 5 of the first light transmissive member to the lower face 8b of the second light transmissive member, thereby increasing the light extraction efficiency of the light emitting devices 100, 100A, and 100B. This is preferable for a structure of a plurality of light emitting elements 30 bonded to a single light transmissive member 10 as it reduces the effect of the arrangement of the light emitting element 30, on the luminous intensity distribution, luminance non-uniformity, and color non-uniformity. Furthermore, a phosphor, diffuser, or the like may be included in the bonding material 15 that bonds the light transmissive member 10 and the light emitting elements 30 together. Moreover, in the case of mounting a plurality of light emitting elements 30, the light transmissive member 10 may be individually bonded to the light emitting elements 30.

In the light emitting devices 100 and 100A-100D according to the embodiment, a protection device, such as a Zener diode, may be mounted on the mounting base 40. Embedding such a protection device in the reflective member 20 can discourage or prevent light extraction efficiency from declining attributable to absorption or blocking of the light from the light emitting element 30 by the protective device.

When two light emitting elements 30 are used, it is preferable to set the space between the two light emitting elements 30 such that the fillets 16 made of the bonding material 15 are formed continuously. Specifically, in the case where any of the light emitting device 100 and 100A-100D includes two or more light emitting elements 30, the distance between two adjacent light emitting element 30 is preferably twice the height of a light emitting element 30 at most.

The light emitting device according to the embodiment can be used as a light source for the headlights of vehicles such as motorcycles and automobiles, or transportation equipment such as ships and aircrafts. In addition, the light emitting device is also applicable as a variety of light sources for various lighting fixtures such as spotlights, display devices, automotive parts, and the like.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
    a plurality of light emitting elements having light extraction faces, respectively, the plurality of light emitting elements being arranged in a line in a first direction; and
    a light transmissive member provided on the plurality of light emitting elements to face the light extraction faces in a height direction of the light emitting device, the light transmissive member comprising:
        a lower face facing towards the light extraction faces, an area of the lower face being larger than a sum of areas of the light extraction faces;
        an upper face provided opposite to the lower face in the height direction, an area of the upper face being smaller than the area of the lower face, the upper face having a rectangular shape that is elongated in the first direction;
        a first side face that is a first vertical side surface and is connected to the lower face and the upper face;
        a second side face that is a second vertical side surface and is connected to the lower face and the upper face, the second side surface is provided opposite to the first side face;
        a third side face that includes a first curved surface and is connected to the lower face and the upper face, the third side face is provided between the first side face and the second side face; and
        a fourth side face that includes a second curved surface and is connected to the lower face and the upper face, the fourth side face is provided between the first side face and the second side face, the fourth side face is opposite to the third side face, the third side face and the fourth side face approaching as approaching from the lower face to the upper face in the height direction,
    wherein the first side face and the second side face are provided on short sides of the rectangular shape, and
    wherein the third side face and the fourth side face are provided on long sides of the rectangular shape.

2. The light emitting device according to claim 1,
wherein the third side face includes a first side face portion connected to the lower face, and
wherein the fourth side face includes a second side face portion connected to the lower face, the second side face being parallel to the first side face.

3. The light emitting device according to claim 2, wherein the first side face portion and the second side face portion are parallel to the height direction.

4. The light emitting device according to claim 1, further comprising:
an additional light transmissive member provided between the light transmissive member and the light extraction faces in the height direction.

5. The light emitting device according to claim 4,
wherein the lower face of the light transmissive member has a lower face perimeter,
wherein the additional light transmissive member comprises an additional upper face connected to the lower face of the light transmissive member and having an additional upper face perimeter, and
wherein the additional upper face perimeter coincides with the lower face perimeter.

6. The light emitting device according to claim 5, wherein the additional light transmissive member is a light conversion member that includes a silicone resin and a phosphor.

7. The light emitting device according to claim 6,
wherein the additional light transmissive member comprises an additional lower face opposite to the additional upper face in the height direction, and
wherein the phosphor is localized on the additional lower face.

8. The light emitting device according to claim 4, further comprising:
a bonding material provided between the plurality of light emitting elements and the additional light transmissive member, the additional light transmissive member being bonded to the plurality of light emitting elements via the bonding material.

9. The light emitting device according to claim 8,
wherein the plurality of light emitting elements have lateral faces connected to light extraction faces, respectively, and
wherein the bonding material covers the lateral faces of the plurality of light emitting elements.

10. The light emitting device according to claim 1, wherein
the light transmissive member is made of a glass material.

11. The light emitting device according to claim 10, wherein
the glass material includes borosilicate glass or quartz glass.

12. The light emitting device according to claim 1, further comprising:
a bonding material provided between the plurality of light emitting elements and the light transmissive member, the light transmissive member being bonded to the plurality of light emitting elements via the bonding material.

13. The light emitting device according to claim 12,
wherein the plurality of light emitting elements have lateral faces connected to light extraction faces, respectively, and
wherein the bonding material covers the lateral faces of the plurality of light emitting elements.

14. The light emitting device according to claim 1, further comprising:
a reflective member with which the first side faces and the second side faces of the first light transmissive member are covered.

15. The light emitting device according to claim 1, wherein the first side face and the second side face are parallel to the height direction.

* * * * *